United States Patent
Chou et al.

(10) Patent No.: US 10,720,702 B2
(45) Date of Patent: Jul. 21, 2020

(54) METHOD AND DEVICE FOR CORRECTING ANTENNA PHASE

(71) Applicant: NATIONAL CHUNG SHAN INSTITUTE OF SCIENCE AND TECHNOLOGY, Taoyuan (TW)

(72) Inventors: Hsi-Tseng Chou, Taipei (TW); Dun-Yuan Cheng, Chung-Li (TW); Kung-Yu Lu, Taoyuan (TW); Nan-Wei Chen, Chung-Li (TW); Ming-Whay Lai, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 265 days.

(21) Appl. No.: 14/990,931

(22) Filed: Jan. 8, 2016

(65) Prior Publication Data

US 2017/0201020 A1    Jul. 13, 2017

(51) Int. Cl.
*H01Q 3/26* (2006.01)
*H01Q 3/36* (2006.01)
*H01Q 1/24* (2006.01)

(52) U.S. Cl.
CPC ............ *H01Q 3/267* (2013.01); *H01Q 3/2605* (2013.01); *H01Q 3/36* (2013.01); *H01Q 1/246* (2013.01)

(58) Field of Classification Search
CPC .................................................. H01Q 3/267; H01Q 3/34; H01Q 3/36; H01Q 3/38; H01Q 3/2605; G01R 29/10

(Continued)

(56) References Cited

U.S. PATENT DOCUMENTS 4,532,518 A * 7/1985 Gaglione ............... H01Q 3/36
                                                333/17.1
4,536,766 A * 8/1985 Frazita .................. H01Q 3/36
                                                342/351

(Continued)

FOREIGN PATENT DOCUMENTS

JP         08201517 A  *  8/1996
WO    WO-2013145047 A1 * 10/2013  ........... H04B 7/0408

OTHER PUBLICATIONS

Son et al. "Automatic Phase Correction of Phased Array Antennas by a Genetic Algorithm." IEEE Trans. on Antennas and Propagation, vol. 56, No. 8. Aug. 2008. pp. 2751-2754. (Year: 2008).*

*Primary Examiner* — Gregory C. Issing
(74) *Attorney, Agent, or Firm* — Schmeiser, Olsen & Watts, LLP

(57) ABSTRACT

A method for correcting antenna phases includes a beam angle calculating step, beam angle adjusting step, antenna emission measuring step and beam angle correcting step. The method involves comparing a difference between the ideal antenna phase value and the measured beam angle value, determining according to the difference that the beam direction of the antenna needs to be corrected, and adding the difference to a current ideal antenna phase value in the algorithm to calculate another ideal antenna phase value for being sent to the phase control circuit and used in executing the beam angle adjusting step in a next instance of measurement process until the beam angle correcting step finds the difference which requires no correction of the beam direction of the antenna. Therefore, temperature-dependent errors do not occur to beam directions, thereby enhancing the communication efficiency of an antenna system.

8 Claims, 2 Drawing Sheets

Figure 1:
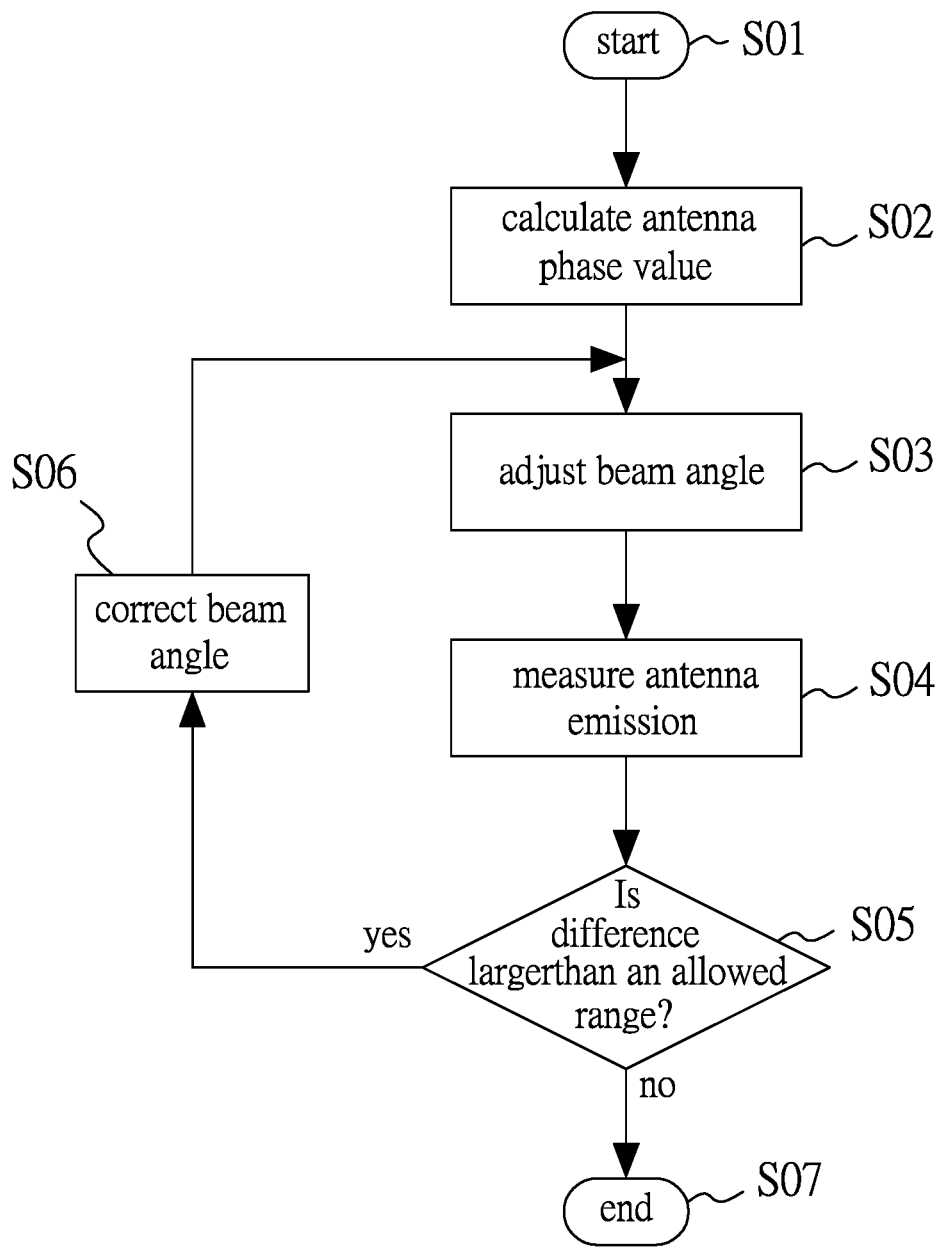

(58) Field of Classification Search
USPC .......................................... 342/368, 372, 359
See application file for complete search history.

(56) References Cited

U.S. PATENT DOCUMENTS

| | | | | |
|---|---|---|---|---|
| H173 H * | 12/1986 | Claborn | ........................ | 342/173 |
| 4,724,440 A * | 2/1988 | Lopez | .................... | H01Q 3/267 |
| | | | | 342/169 |
| 4,926,186 A * | 5/1990 | Kelly | .................... | H01Q 3/267 |
| | | | | 342/173 |
| 5,072,228 A * | 12/1991 | Kuwahara | .............. | H01Q 3/267 |
| | | | | 342/360 |
| 5,187,486 A * | 2/1993 | Kolzer | ................ | H01Q 3/2605 |
| | | | | 342/360 |
| 5,530,449 A * | 6/1996 | Wachs | .................. | H01Q 3/267 |
| | | | | 342/174 |
| 5,680,141 A * | 10/1997 | Didomenico | .......... | H01Q 3/267 |
| | | | | 342/157 |
| 6,046,697 A * | 4/2000 | Overbury | ............... | H01Q 3/267 |
| | | | | 342/174 |
| 6,147,643 A * | 11/2000 | Aubry | ..................... | H01Q 3/26 |
| | | | | 342/174 |
| 6,768,455 B1 * | 7/2004 | Werntz | .................. | H01Q 3/267 |
| | | | | 342/174 |
| 7,053,828 B1 * | 5/2006 | Goodzeit | ................ | H01Q 3/26 |
| | | | | 342/359 |
| 7,092,690 B2 * | 8/2006 | Zancewicz | ........... | H01Q 3/2605 |
| | | | | 342/368 |
| 7,994,980 B2 * | 8/2011 | Son | ........................ | H01Q 3/267 |
| | | | | 342/372 |
| 8,299,964 B2 * | 10/2012 | Janaswamy | .......... | H01Q 3/2652 |
| | | | | 342/174 |
| 9,130,270 B1 * | 9/2015 | Nelson | .................. | H01Q 3/267 |
| 10,096,899 B2 * | 10/2018 | Renard | .................. | H01Q 3/267 |
| 2003/0190904 A1 * | 10/2003 | Mar | ....................... | H01Q 3/267 |
| | | | | 455/277.2 |
| 2004/0032365 A1 * | 2/2004 | Gottl | ..................... | H01Q 1/246 |
| | | | | 342/368 |
| 2010/0033375 A1 * | 2/2010 | Mason | ................ | H01Q 3/2605 |
| | | | | 342/372 |
| 2016/0043465 A1 * | 2/2016 | McDevitt | .............. | H01Q 3/267 |
| | | | | 342/368 |

* cited by examiner

METHOD AND DEVICE FOR CORRECTING ANTENNA PHASE

FIELD OF TECHNOLOGY

The present invention relates to methods and devices for correcting antenna phases and more particularly to a method and device for correcting antenna phases.

BACKGROUND

A conventional antenna system uses an algorithm to control a phase control circuit and adjust beam directions. However, the phase control circuit leads to errors when subjected to temperature-induced interference, and thus the directions of the beams of the conventional antenna system can hardly be adjusted correctly. To overcome the aforesaid drawback, the prior art requires executing an optimization program repeatedly to augment the communication strength of the conventional antenna system. However, over-execution of the optimization program results in an increase of the operating temperature of the phase control circuit to therefore cause errors.

Another conventional antenna system is characterized by a thermometer and a coolant which are disposed beside the phase control circuit to keep the temperature of the phase control circuit within a specific range so as to preclude the undesired effect which might otherwise be brought about by an increase in the temperature. Although the aforesaid conventional antenna system is effective in controlling the operating temperature of the control phase control circuit, it incurs higher equipment costs.

Accordingly, it is imperative to provide a method and device for correcting antenna phases to overcome the aforesaid drawbacks of the prior art.

SUMMARY

It is an objective of the present invention to provide a method and device for correcting antenna phases regardless of the operating temperature of an electronic phase shifter In order to achieve the above and other objectives, the present invention provides a method for correcting antenna phases, adapted to correct a direction of a beam of an antenna controlled with a phase control circuit, the method comprising a beam angle calculating step, beam angle adjusting step, antenna emission measuring step, determining step and beam angle correcting step. The beam angle calculating step calculates an ideal antenna phase value with an algorithm according to a predetermined beam direction and sends the ideal antenna phase value to the phase control circuit. The beam angle adjusting step adjusts the direction of the beam emitted from the antenna with the phase control circuit according to the ideal antenna phase value. The antenna emission measuring step measures the direction of the beam of the antenna to obtain a measured beam angle value. The determining step compares the ideal antenna phase value and the measured beam angle value to find a difference therebetween, and then determines whether the difference goes beyond an allowed range of errors, wherein the determining step is followed by the beam angle correcting step if the difference goes beyond the allowed range of errors, otherwise process flow of the method ends. The beam angle correcting step adds the difference to a current ideal antenna phase value in the algorithm to calculate another ideal antenna phase value for being sent to the phase control circuit and used in executing the beam angle adjusting step in a next instance of measurement process until the determining step determines that the difference does not go beyond the allowed range of errors.

In an embodiment of the present invention, in the beam angle adjusting step, after the phase control circuit has received the other ideal antenna phase value, the beam direction of the antenna is reset to an initial direction and then adjusted according to the other ideal antenna phase value.

In an embodiment of the present invention, in the beam angle adjusting step, after the phase control circuit has received the other ideal antenna phase value, the beam direction of the antenna is adjusted according to the difference between the ideal antenna phase value and the other ideal antenna phase value.

In an embodiment of the present invention, the algorithm is a gene algorithm.

In order to achieve the above and other objectives, the present invention further provides a device for correcting antenna phases, adapted to adjust a beam angle of an antenna, the device comprising: a calculation module for calculating an ideal antenna phase value with an algorithm according to a predetermined beam direction and sending the ideal antenna phase value; a phase control module coupled to the calculation module to adjust the direction of the beam emitted from the antenna according to the ideal antenna phase value received; and a measurement module coupled to the calculation module to measure an emission situation of the antenna so as to generate and send a measured beam angle value to the calculation module, wherein the calculation module compares the ideal antenna phase value and the measured beam angle value to calculate a difference therebetween, wherein, when the beam direction of the antenna needs to correct, adds the difference to a current ideal antenna phase value and calculates with the algorithm according to the difference another ideal antenna phase value for being sent to the phase control circuit and used in executing the beam angle adjusting step in a next instance of measurement process until the difference which requires no correction of the beam direction of the antenna is found.

In an embodiment of the present invention, after the phase control module has received the other ideal antenna phase value, the beam direction of the antenna is reset to an initial direction and then adjusted according to the other ideal antenna phase value.

In an embodiment of the present invention, after the phase control module has received the other ideal antenna phase value, the beam direction of the antenna is adjusted according to the difference between the ideal antenna phase value and the other ideal antenna phase value.

In an embodiment of the present invention, the phase control module is an electronic phase shifter.

In an embodiment of the present invention, the antenna is an array antenna or a base station antenna.

Hence, the correction method and correction device of the present invention take into account of the difference between an ideal antenna phase value and a measured beam angle value and add the difference to a current ideal antenna phase value in the algorithm to allow antenna phase changes to meet expectations, allow the beam angle of the antenna to meet expectations, and enhance the communication efficiency of the antenna system by ensuring that temperature-dependent errors will not happen to the beam direction of the antenna system.

BRIEF DESCRIPTION

Figure 2:
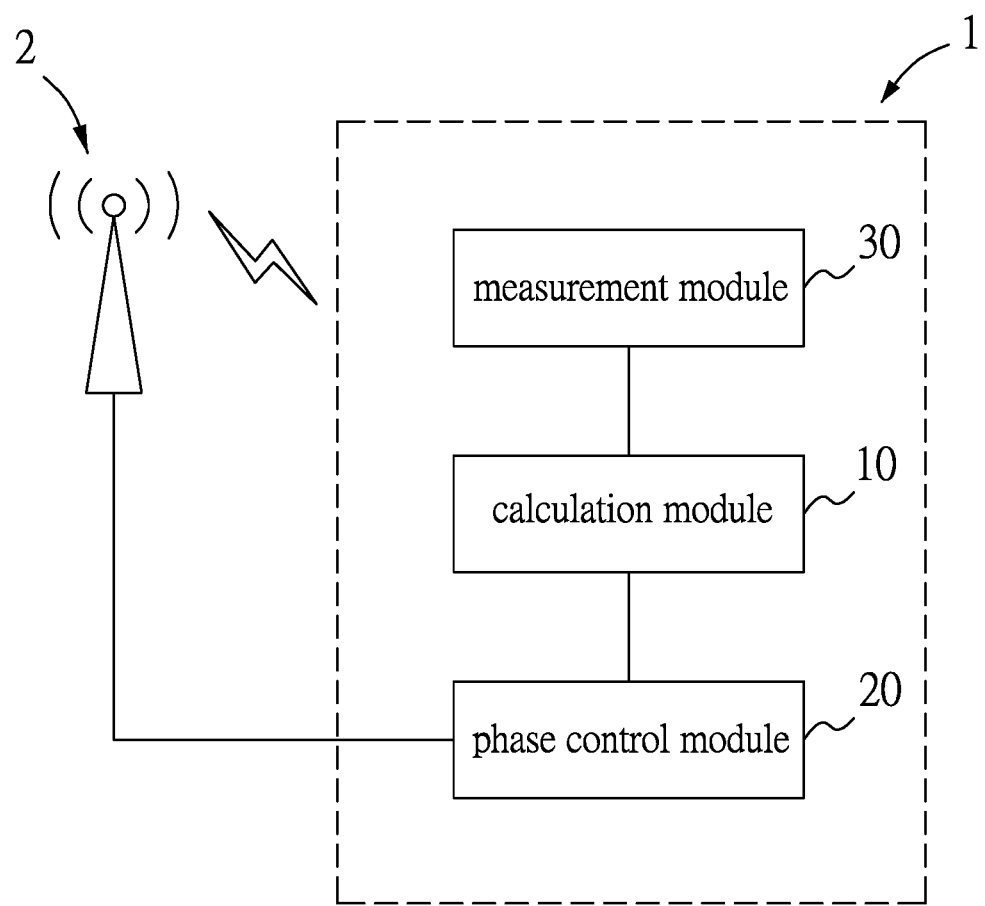

Objectives, features, and advantages of the present invention are hereunder illustrated with specific embodiments in conjunction with the accompanying drawings, in which:

FIG. 1 is a function block diagram of a device for correcting antenna phases according to an embodiment of the present invention; and FIG. 2 is a flowchart of a method for correcting antenna phases according to an embodiment of the present invention.

DETAILED DESCRIPTION

An embodiment of the present invention is applicable to a high-gain and high-directivity base station antenna system or smart antenna system. The antenna systems usually use an array antenna to achieve high-gain and high-directivity characteristics and enhance the performance of services offered to receiver ends in a specific region by adjusting the beam direction of the antenna. In various embodiments of the present invention, the beam direction refers to the main beam direction of the antenna, but the present invention is not limited thereto, as beams emitted from any similar antenna and directed in a specific direction are also applicable to the present invention.

Referring to FIG. 1 and FIG. 2, there are shown a function block diagram of a device for correcting antenna phases according to an embodiment of the present invention and a flowchart of a method for correcting antenna phases according to an embodiment of the present invention, respectively. The correction device 1 controls an antenna 2 and comprises a calculation module 10, a phase control module 20 and a measurement module 30.

The calculation module 10 calculates an ideal antenna phase value with an algorithm according to a user-defined beam direction whenever the user wants to adjust the beam direction of the antenna 2 and then outputs the ideal antenna phase value. The algorithm is a gene algorithm. Persons skilled in the art understand that the gene algorithm is an optimization technique developed by simulating the evolution mechanism typical of organisms, and that better solutions can be provided by taking account of the degree of adaptation in the solutions of each generation of the gene algorithm and then effectuating evolution to thereby generate the solution of a next generation.

The phase control module 20 is coupled to the calculation module 10. After the phase control module 20 has received the ideal antenna phase value, the phase control module 20 adjusts the phase of the antenna 2 according to the ideal antenna phase value and thus changes the direction of the beam emitted from the antenna 2. The phase control module 20 is an electronic phase shifter.

The measurement module 30 is coupled to the calculation module 10. After the beam direction of the antenna 2 has been changed, the measurement module 30 measures the emission situation of the antenna 2 and thus obtains a measured beam angle value. In this regard, the measurement module 30 sends the measured beam angle value to the calculation module 10.

Due to external factors related to temperature and electromagnetic interference, the phase control module 20 may fail to adjust accurately the direction of the beam emitted from the antenna 2, and in consequence the actual direction of the beam emitted from the antenna 2 does not meet expectations. Hence, after the calculation module 10 has received the measured beam angle value from the measurement module 30, the calculation module 10 compares the ideal antenna phase value and the measured beam angle value to calculate the difference therebetween. If the difference falls within an allowed range, it indicates that the beam direction of the antenna 2 is correct, and thus the beam direction of the antenna 2 requires no further correction. If the difference falls outside the allowed range, it indicates that the beam direction of the antenna 2 has a significant error and thus requires further correction made by the phase control module 20; hence, the calculation module 10 generates a second-generation ideal antenna phase value with the gene algorithm and according to the difference. Then, the calculation module 10 sends the second-generation ideal antenna phase value to the phase control module 20 to execute the beam angle adjusting step in the next instance of measurement process. Eventually, repeated instances of measurement process generate new-generation ideal antenna phase values repeatedly until the difference between the ideal antenna phase value and the measured beam angle value falls within the allowed range, thereby ending the correction operation.

In an embodiment, after the phase control module 20 has received the second-generation ideal antenna phase value, the phase control module 20 resets the beam direction of the antenna 2 to the initial direction and then adjusts the beam direction of the antenna 2 according to the second-generation ideal antenna phase value. In another embodiment, after the phase control module 20 has received the second-generation ideal antenna phase value, the phase control module 20 adjusts the beam direction of the antenna 2 according to the difference between the ideal antenna phase value and the second-generation ideal antenna phase value without resetting the beam direction of the antenna 2 to the initial direction first.

The correction method of the present invention is hereunder described mathematically. The definitions of related parameters for use in the mathematical expressions of the correction method of the present invention are presented below.

$\theta_{mb}$: beam angle to be adjusted
$\theta_{gai}$: ideal antenna phase value calculated with the gene algorithm
$\theta_i$: measured beam angle value measured with the measurement module 30
i: number of instances of measurement
$\varphi_k$: difference between ideal antenna phase value and measured beam angle value
k: number of instances of measurement
$\alpha$: allowed range of errors After the beam angle $\theta_{mb}$ of the antenna 2 has been configured, the first-instance measurement process begins; meanwhile, i=1, $\theta_{mb}=\theta_{ga1}$, wherein the actually measured beam angle value is denoted with $\theta_i$, and the difference $\varphi_1=\theta_{ga1}-\theta_1$. If $|\varphi_1|>\alpha$ (i.e., the difference is larger than an allowed range of errors), then the second measurement will begin. The second-instance measurement process requires that the difference $\varphi_1$ of the first-instance measurement process must be taken into account; meanwhile i=2, $\theta_{ga2}=\theta_{ga1}+\varphi_1$, wherein the actually measured beam angle value is denoted with $\theta_2$, and the difference $\varphi_2=\theta_{ga2}-\theta_2$. If $|\varphi_2|>\alpha$, then the third-instance measurement process will begin, that is, i=3, $\theta_{ga3}=\theta_{ga2}+\varphi_2$, until $|\varphi_k|\leq\alpha$ which means that the difference falls within the allowed range of errors, thereby ending the process flow of the correction method.

Referring to FIG. 1, there is shown a flowchart of a method for correcting antenna phases according to an embodiment of the present invention.

After the beam direction of the antenna has been determined, step S01 begins, thereby starting the process flow of the correction method. The beam angle calculating step S02 involves calculating an ideal antenna phase value with an algorithm according to a predetermined beam direction and sending the ideal antenna phase value to the phase control circuit. The beam angle adjusting step S03 involves adjusting the direction of the beam emitted from the antenna with the phase control circuit according to the ideal antenna phase value. The antenna emission measuring step S04 involves measuring the direction of the beam of the antenna to obtain a measured beam angle value. The determining step S05 involves comparing the ideal antenna phase value and the measured beam angle value to find the difference therebetween, followed by determining whether the difference goes beyond an allowed range of errors. The determining step S05 will be followed by the beam angle correcting step S06 if the difference goes beyond an allowed range of errors. The determining step S05 will be followed by step S07 to end the process flow of the correction method if the difference does not go beyond the allowed range of errors. The beam angle correcting step S06 involves adding the difference to a current ideal antenna phase value in the algorithm to calculate another ideal antenna phase value for being sent to the phase control circuit and used in executing the beam angle adjusting step S03 in a next instance of measurement process until the determining step S05 determines that the difference does not go beyond the allowed range of errors.

Hence, the correction method and correction device of the present invention take into account of the difference between an ideal antenna phase value and a measured beam angle value and add the difference to a current ideal antenna phase value in the algorithm to allow antenna phase changes to meet expectations, allow the beam angle of the antenna to meet expectations, and enhance the communication efficiency of the antenna system by ensuring that temperature-dependent errors will not happen to the beam direction of the antenna system.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A method for correcting antenna phases of a telecommunications system, adapted to correct a direction of a beam emitted by an antenna controlled with a phase control circuit, the method comprising:
    a beam angle calculating step for calculating an ideal beam angle value with gene algorithm according to a predetermined beam direction and sending the ideal beam angle value to the phase control circuit;
    a beam angle adjusting step for adjusting the direction of the beam emitted from the antenna with the phase control circuit according to the ideal beam angle value;
    an antenna emission measuring step for measuring the direction of the beam on a side that emits the beam to obtain a measured beam angle value;
    a determining step for subtracting the measured beam angle value from the ideal beam angle to obtain a difference; and
    a beam angle correcting step for adding the difference to a current ideal beam angle value in the gene algorithm to calculate another ideal beam angle value for being sent to the phase control circuit and used in executing the beam angle adjusting step in a next instance of measurement process until the determining step determines that the difference does not go beyond an allowed range of errors,
    wherein the gene algorithm is used to implement an iteration of the difference automatically and generates the another ideal beam angle value for avoiding temperature-dependent errors occurring to the direction.

2. The method of claim 1, wherein, in the beam angle adjusting step, after the phase control circuit has received the other ideal beam angle value, the beam direction of the antenna is reset to an initial direction and then adjusted according to the other ideal beam angle value.

3. The method of claim 1, wherein, in the beam angle adjusting step, after the phase control circuit has received the other ideal beam angle value, the beam direction of the antenna is adjusted according to the difference between the ideal beam angle value and the other ideal beam angle value.

4. A device for correcting antenna phases of a telecommunications system, adapted to adjust a beam angle of an antenna, the device comprising:
    a calculation module for calculating an ideal beam angle value with a gene algorithm according to a predetermined beam direction and sending the ideal beam angle value;
    a phase control module coupled to the calculation module to adjust the direction of the beam emitted from the antenna according to the ideal beam angle value received, wherein the phase control module is an electronic phase shifter; and
    a measurement module coupled to the calculation module to measure and generate a measured beam angle value of the beam on a side that emits the beam and send the measured beam angle value to the calculation module,
    wherein the calculation module subtracts the measured beam angle value from the ideal beam angle value to obtain a difference, adds the difference to a current ideal beam angle value and calculates with the gene algorithm that automatically implements an iteration of the difference to calculate another ideal beam angle value for being sent to the phase control circuit and used in adjust the beam angle in a next instance of measurement process until the difference which requires no correction of the beam direction of the antenna is found, so as temperature-dependent errors do not occur to the direction of the beam.

5. The device of claim 4, wherein, after the phase control module has received the other ideal beam angle value, the beam direction of the antenna is reset to an initial direction and then adjusted according to the other ideal beam angle value.

6. The device of claim 4, wherein, after the phase control module has received the other ideal beam angle value, the beam direction of the antenna is adjusted according to the difference between the ideal beam angle value and the other ideal beam angle value.

7. The device of claim 4, wherein the antenna is an array antenna.

8. The device of claim 4, wherein the antenna is a base station antenna.

* * * * *